(12) United States Patent
Lagouge et al.

(10) Patent No.: US 9,704,784 B1
(45) Date of Patent: Jul. 11, 2017

(54) METHOD OF INTEGRATING A COPPER PLATING PROCESS IN A THROUGH-SUBSTRATE-VIA (TSV) ON CMOS WAFER

(71) Applicant: Freescale Semiconductor, Inc., Austin, TX (US)

(72) Inventors: Matthieu Lagouge, Brossard (CA); Qing Zhang, Montreal (CA); Mohommad Choudhuri, Brossard (CA); Gul Zeb, Montreal (CA)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/209,964

(22) Filed: Jul. 14, 2016

(51) Int. Cl.
*H01L 23/48* (2006.01)
*H01L 23/52* (2006.01)
*H01L 21/768* (2006.01)
*H01L 21/288* (2006.01)
*H01L 23/532* (2006.01)
*H01L 21/3065* (2006.01)
*H01L 21/3213* (2006.01)

(52) U.S. Cl.
CPC ........ *H01L 23/481* (2013.01); *H01L 21/2885* (2013.01); *H01L 21/3065* (2013.01); *H01L 21/32134* (2013.01); *H01L 21/76841* (2013.01); *H01L 21/76873* (2013.01); *H01L 21/76879* (2013.01); *H01L 21/76898* (2013.01); *H01L 23/53238* (2013.01)

(58) Field of Classification Search
CPC ......... H01L 21/76843; H01L 21/76831; H01L 23/481; H01L 21/76841; H01L 21/2885; H01L 21/32134
USPC ....................................... 257/751
See application file for complete search history.

(56) References Cited

U.S. PATENT DOCUMENTS

| 7,728,358 B2 * | 6/2010 | Ono .................. H01L 29/66242 257/183 |
| 2012/0196441 A1 | 8/2012 | Mevelle et al. |
| 2013/0285257 A1 | 10/2013 | Lee et al. |
| 2013/0313688 A1 * | 11/2013 | Nomura ............ H01L 21/76877 257/621 |

* cited by examiner

*Primary Examiner* — Theresa T Doan (57) ABSTRACT

A semiconductor device composed of a through-substrate-via (TSV) interconnect, and methods for forming the interconnect.

16 Claims, 13 Drawing Sheets

METHOD OF INTEGRATING A COPPER PLATING PROCESS IN A THROUGH-SUBSTRATE-VIA (TSV) ON CMOS WAFER

FIELD OF THE INVENTION

The present disclosure relates generally to semiconductor processing, and more specifically, to methods for forming a through-substrate-via (TSV) in semiconductor devices.

BACKGROUND OF THE INVENTION

Conventional 3D integration processes utilize through-substrate-vias (TSV) as an alternative to wire bonds and flip chips, to allow chips to be stacked vertically. A TSV is a vertical electrical interconnect that passes through a device wafer or other semiconductor substrate, and is exposed from the back surface of the device wafer. The TSV facilitates electrical connections between two or more vertically stacked wafers and/or chips.

Such TSVs are typically filled by an electroplating process. For example, TSV copper interconnects are typically produced by etching a via through a device wafer, depositing an insulating dielectric layer and a barrier layer, depositing a copper seed layer, filling of the vias by copper electrodeposition, and removing the excess copper by chemical-mechanical planarization (CMP).

However, there is a problem with forming a TSV opening and interconnect on a semiconductor device that has undergone CMOS (complementary metal-oxide semiconductor) processing. Forming a TSV opening on a CMOS device at the backend of processing, requires establishing an electrical connection to existing features on the CMOS device. Conventional approaches for forming a TSV opening on the backside of a CMOS device wafer can land the TSV opening on a metal layer of a metallization structure of the device.

Typically, CMOS processing utilizes metallization layers composed of a metal layer (e.g., aluminum (Al), copper (Cu), etc.) situated between a barrier layer (e.g., titanium (Ti), titanium/titanium nitride (Ti/TiN), tantalum/tantalum nitride (Ta/TaN), etc.). Etching to form the TSV opening can expose the metal layer (e.g., aluminum, etc.) which may be incompatible with the chemistry used to fill the TSV opening.

Moreover, while titanium and titanium nitride are compatible with most plating chemistries, it is difficult to form a TSV opening that involves etching through backend layers of a CMOS device and finishing on a TiN layer to facilitate a plating process. Such a process requires a buried oxide (BOX) etch that stops on TiN. However, BOX etches generally provides poor selectivity of oxide (e.g., silicon oxide, $SiO_2$) versus TiN.

BRIEF DESCRIPTION OF THE DRAWINGS

Example embodiments of the present invention are illustrated by way of example and are not limited by the accompanying figures, in which like references indicate similar elements. Elements in the figures are illustrated for simplicity and clarity and have not necessarily been drawn to scale.

DETAILED DESCRIPTION

Example embodiments of the disclosure generally include semiconductor devices, and methods for forming the devices. The illustrated example embodiments correspond to the formation of semiconductor devices in the form of a CMOS device which is structured with a through-substrate-via (TSV) opening and TSV interconnect according to various example embodiments of the disclosure.

The present disclosure provides an improved method for integrating a TSV interconnect into a CMOS structure using a backend processing approach. The disclosure overcomes the aforementioned problems by using a modified etch and electroplating process to form and fill the TSV opening. In example embodiments, the TSV opening is fabricated by forming an opening through a device wafer (or other semiconductor substrate) to expose a metal (e.g., aluminum) layer of a metallization structure, removing all or part of the metal (e.g. aluminum) layer to expose an underlying barrier layer (e.g., Ti and/or TiN), and filling the TSV opening with a metal (e.g., copper) by an electroplating deposition process. The present disclosure overcomes the problem of forming copper TSV interconnects to a metallization structure composed of metallization layers (e.g., a metal-1 layer) that may be incompatible with the TSV plating chemistry. The present methods can be used to fabricate TSV interconnects in three dimensional (3D) packaging, such as, for example, interposers, wafer level packaging, system in package (SiP) and package on package (PoP) applications, among others.

Figure 1:
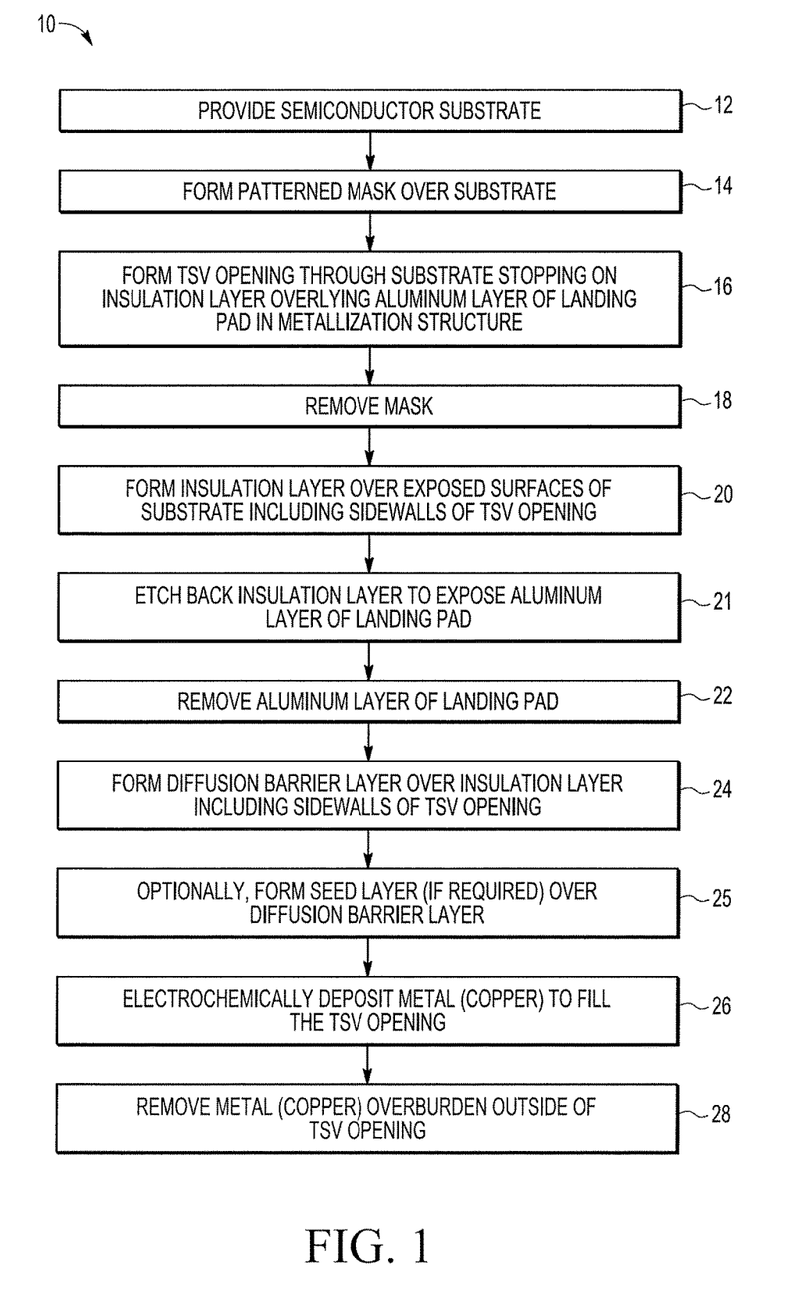
FIG. 1 is flow diagram illustrating a fabrication sequence to construct a through-substrate-via (TSV) opening and interconnect according to an example embodiment of the invention.

FIG. 1 is a flowchart showing an example embodiment of a process flow 10 for fabricating a through-substrate-via (TSV) opening in an integrated circuit (IC).

Figure 2:
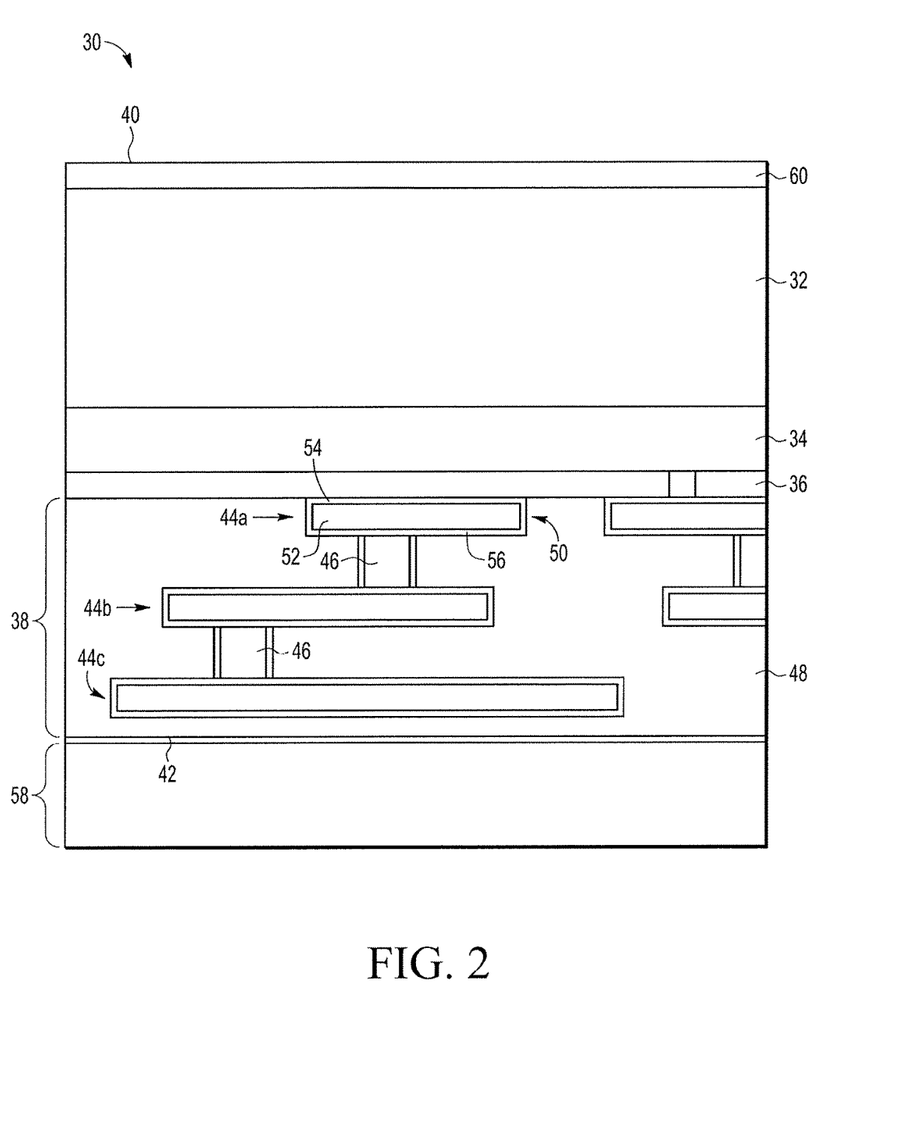
FIG. 2 is a cross-sectional, elevational view of an example embodiment of a substrate for use in the procedure illustrated in FIG. 1.

The example embodiment of the fabrication procedure 10 commences at block 12 where a semiconductor substrate (e.g., device wafer) that has undergone CMOS (complementary metal-oxide semiconductor) processing (FIG. 2) is provided. In the illustrated example embodiments, the semiconductor substrate (CMOS structure) 30 includes a semiconductor bulk substrate 32, a device (active) layer 34, an insulation layer 36 (e.g., $SiO_2$, etc.), and a metallization (routing) structure 38. As shown in FIG. 2, the CMOS structure 30 is in an inverted ("flipped") position with a back surface 40 oriented upward and a front surface 42 oriented downward. In example embodiments, the bulk substrate 32 can comprise a silicon or silicon-based material, and the active layer 34 can be composed of doped and undoped areas and include circuit elements such as transistors, capacitors, inductors, resistors, diodes and the like. Interconnects extend through the insulation layer 36 to connect features of the active layer 34 to routing (metal) features of the metallization structure 38. As shown in FIG. 2, the metallization (routing) structure 38 includes a landing pad 44 for a through-substrate via (TSV).

Processing steps to form the CMOS active layer 34 and the metallization (routing) structure 38 are well known in the art. In the example embodiment illustrated in FIG. 2, the metallization structure 38 includes multiple interconnect (metallization) layers 44a, 44b, 44c, and contact vias 46 formed of electrically conductive metals such as aluminum, copper, titanium, titanium nitride, tungsten, polysilicon, metal silicide, etc. It is understood that a CMOS structure can have any number of metallization layers. In the example embodiment, the metallization structure 38 includes three electrically conductive metal layers: a first level of metallization (metal-1) 44a, which provides for local interconnects, and two other levels of metallization (e.g., metal-2 and metal-3) 44b, 44c, which provide for longer interconnects. The metallization structure 38 further includes interlayer dielectric (ILD) material 48 such as silicon dioxide ($SiO_2$), silicon nitride (SN), silicon oxynitride or spin-on glass, among others. The interlayer dielectric (ILD) material 48 isolates the conductive features of the metallization structure. The contact vias 46 extend through the interlayer dielectric material (ILD) 48 to connect the interconnect layers, (e.g., metal-1 layer 44a to metal-2 layer 44b).

As illustrated in FIG. 2, the metal-1 layer 44a is composed of one or more TSV contact or landing pads 50. In embodiments, the TSV landing pad 50 can be composed of a thin metal layer 52 (e.g., aluminum, copper, or other landing material) interposed between a barrier layer 54, 56 (e.g., Ti, Ti/TiN, Ta/TaN, etc.). In embodiments, the metal layer 52 is generally 0.5 to 2 μm thick, and more typically 1 μm thick. In embodiments, the first and second barrier layers 54, 56 are generally 0.002 to 0.1 μm thick, and more typically 0.01 μm thick.

In the example embodiment, the metal-1 TSV landing pad 50 is composed of a thin layer 52 of aluminum interposed between stacked layers of titanium (Ti) and titanium nitride (TiN), which form a first Ti/TiN layer 54 and a second Ti/TiN layer 56. In embodiments, the aluminum layer 52 can be composed of at least 90%, or 99% or more, aluminum by atomic weight. In embodiments, the aluminum layer can be composed of aluminum mixed with other materials or an aluminum alloy (e.g., an alloy of 99.5% aluminum with 0.5% copper).

In the example embodiment, the CMOS structure 30 is bonded by a conductive material (e.g., a metal eutectic bonding) to a substrate 58 such as a MEMS wafer, another CMOS wafer, non-silicon based wafer, a temporary carrier substrate, among others. In an example embodiment, a spacer, optionally containing embedded routing, can be positioned between the CMOS structure 30 and another wafer (e.g., MEMS wafer). In an example embodiment, the CMOS structure 30 can be thinned on the back surface 40, for example, by grinding, chemical mechanical polishing (CMP), plasma etching and/or wet etching the back surface 40. In the example embodiment illustrated in FIG. 2, a dielectric layer 60 (e.g., silicon dioxide, $SiO_2$) is formed over the back surface 40 of the CMOS structure 30. The dielectric layer 60 can be formed by known methods such as chemical vapor deposition (CVD). In some embodiments, the CMOS structure 30 does not include a dielectric layer.

Next, at block 14 (FIG. 3), in an example embodiment, a patterned mask 62 is formed over the dielectric layer 60, which defines an opening 63 where a through-substrate-via (TSV) opening is to be formed through the CMOS structure 30. The mask 62 can be a hard mask (e.g., a nitride layer, TEOS or other suitable material) or photoresist mask, formed by known methods. In some embodiments, the dielectric layer 60 (e.g., TEOS) can function as a hard mask wherein layer 60 would be patterned to define the opening 63, and a separate mask layer 62 would not be required.

Figure 3:
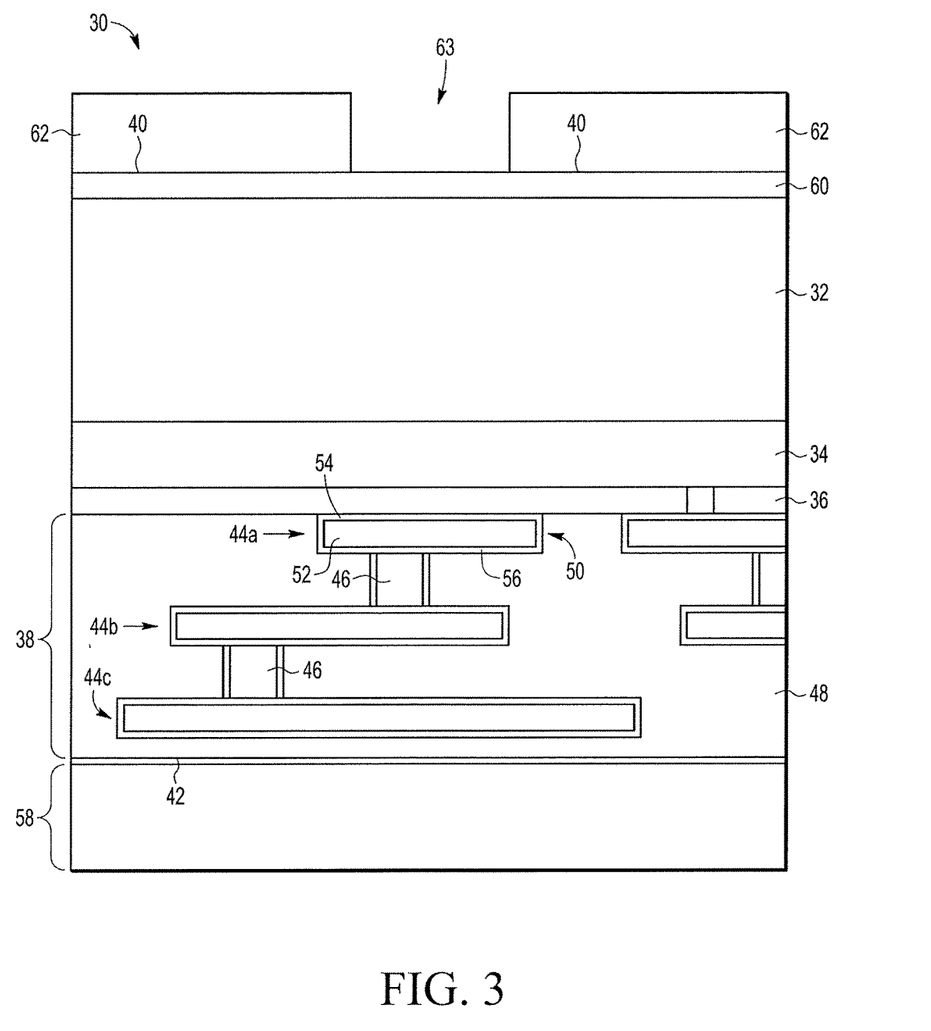
FIG. 3 is a cross-sectional, elevational view of the substrate of FIG. 2, at a subsequent process step according to the operational sequence of FIG. 1, showing the formation of a photomask on the substrate.

A TSV via opening 64 is then formed through the CMOS structure 30 between the back surface 40 and the TSV landing pad 50 within the metal-1 layer 44a.

Figure 4:
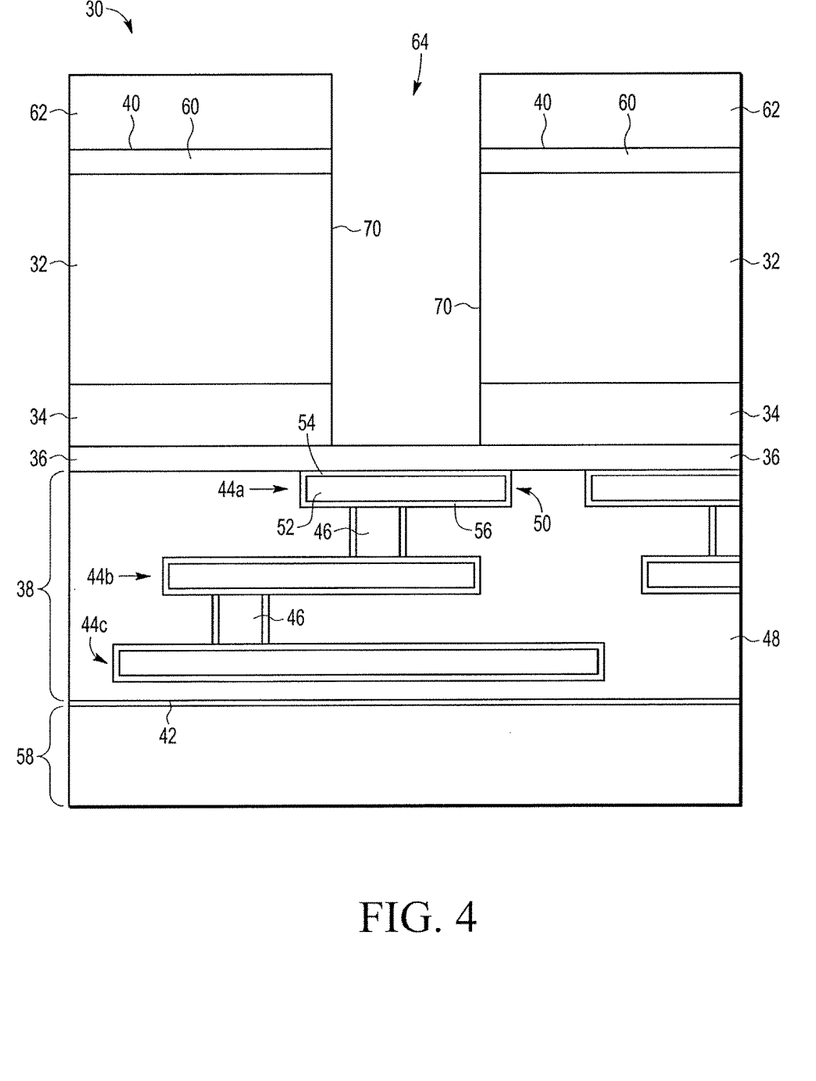
FIG. 4 is a cross-sectional, elevational view of the substrate of FIG. 3, at a subsequent process step according to the operational sequence of FIG. 1, showing the formation of a via (TSV) opening through the substrate.

At block 16, the TSV via opening 64 can be formed by first dry etching of the bulk substrate (e.g., silicon) 32 and active layer 34, stopping on the insulation (e.g., oxide) layer 36 as illustrated in FIG. 4. The etch of the TSV via opening 64 can be conducted, for example, by plasma etching, reactive ion etching (RIE), ion beam etching, magnetically enhanced RIE, inductively coupled plasma (ICP), laser drilling, or other suitable method using a fluorine- or fluoride-based plasma etchant. For example, the via opening 64 can be etched through a bulk silicon substrate 32 and active layer 34 in a reactive ion etching (RIE) chamber with chemistries based on tetrafluoromethane ($CF_4$), trifluoromethane ($CHF_3$), hexafluoroethane ($C_2F_6$), octafluoropropane ($C_3F_8$), octafluorocyclobutane ($C_4F_8$), sulfur hexafluoride ($SF_6$), nitrogen trifluoride ($NF_3$), hexafluoro-2-butyne ($C_4F_6$), perfluorocyclopentene ($C_5F_8$), or combinations thereof.

Figure 5:
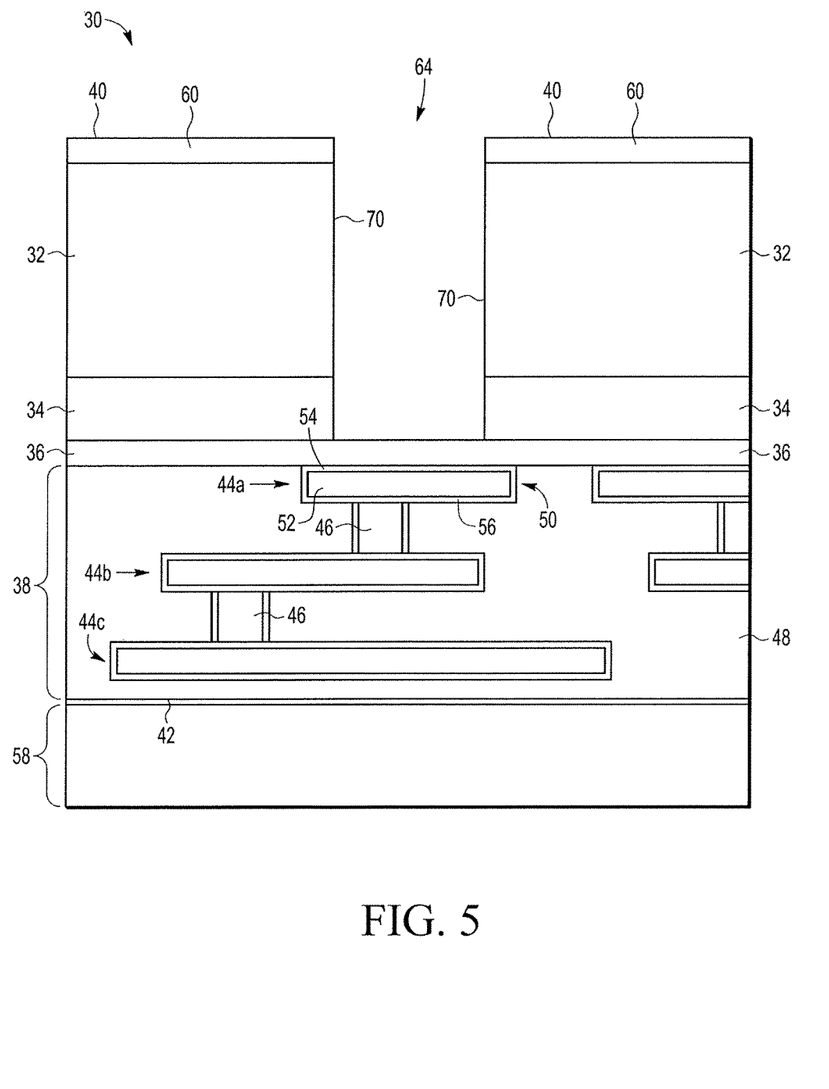
FIG. 5 is a cross-sectional, elevational view of the substrate of FIG. 4, at a subsequent process step according to the operational sequence of FIG. 1, showing the substrate after removal of the photomask.

Next, at block 18, in the example embodiment, the mask 62 (e.g., photoresist mask) can then be removed, as illustrated in FIG. 5, and a clean process can be performed to remove the remaining residues, as known in the art. In other embodiments using either a patterned dielectric layer 60 or a separate patterned layer 62 (e.g., TEOS) as a hard mask, the mask can be left in place.

Figure 6:
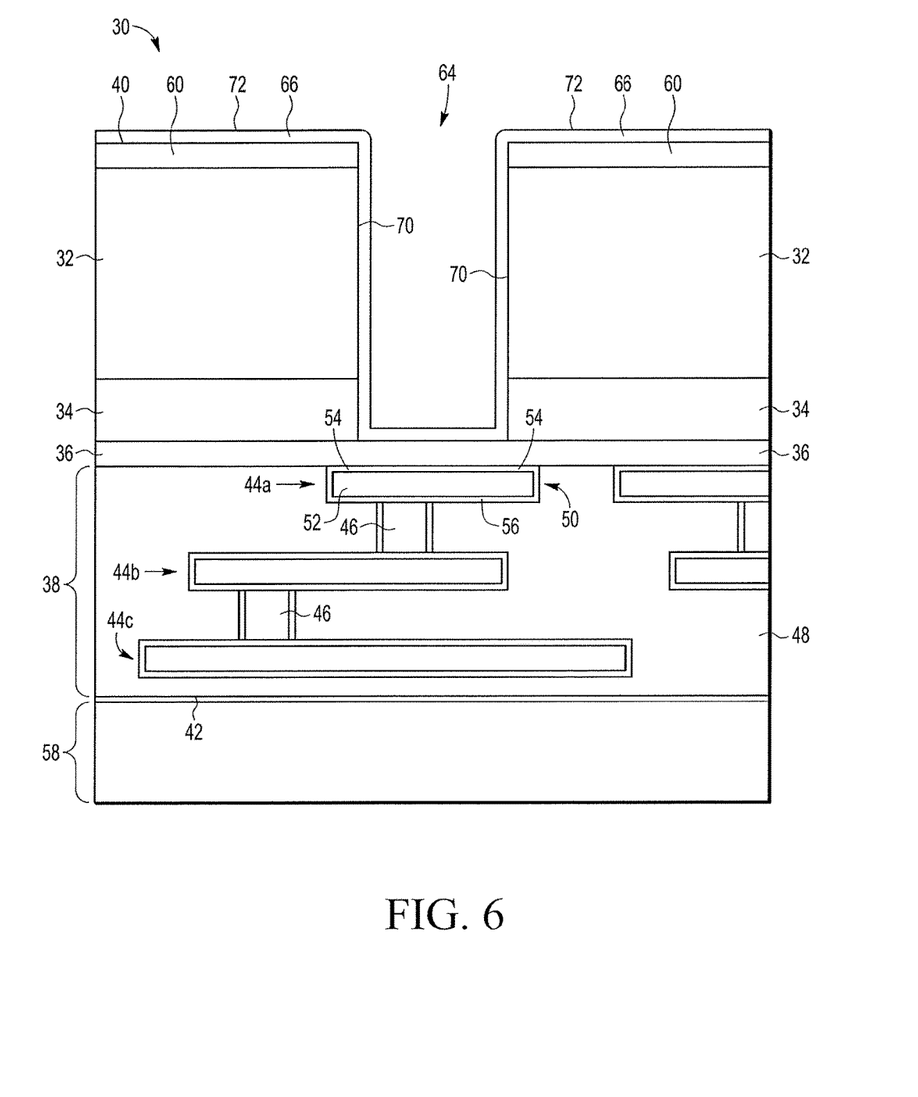
FIG. 6 is a cross-sectional, elevational view of the substrate of FIG. 5, at a subsequent process step according to the operational sequence of FIG. 1, showing an insulation layer deposited on exposed surfaces of the substrate including the sidewalls of the TSV opening.
Figure 7:
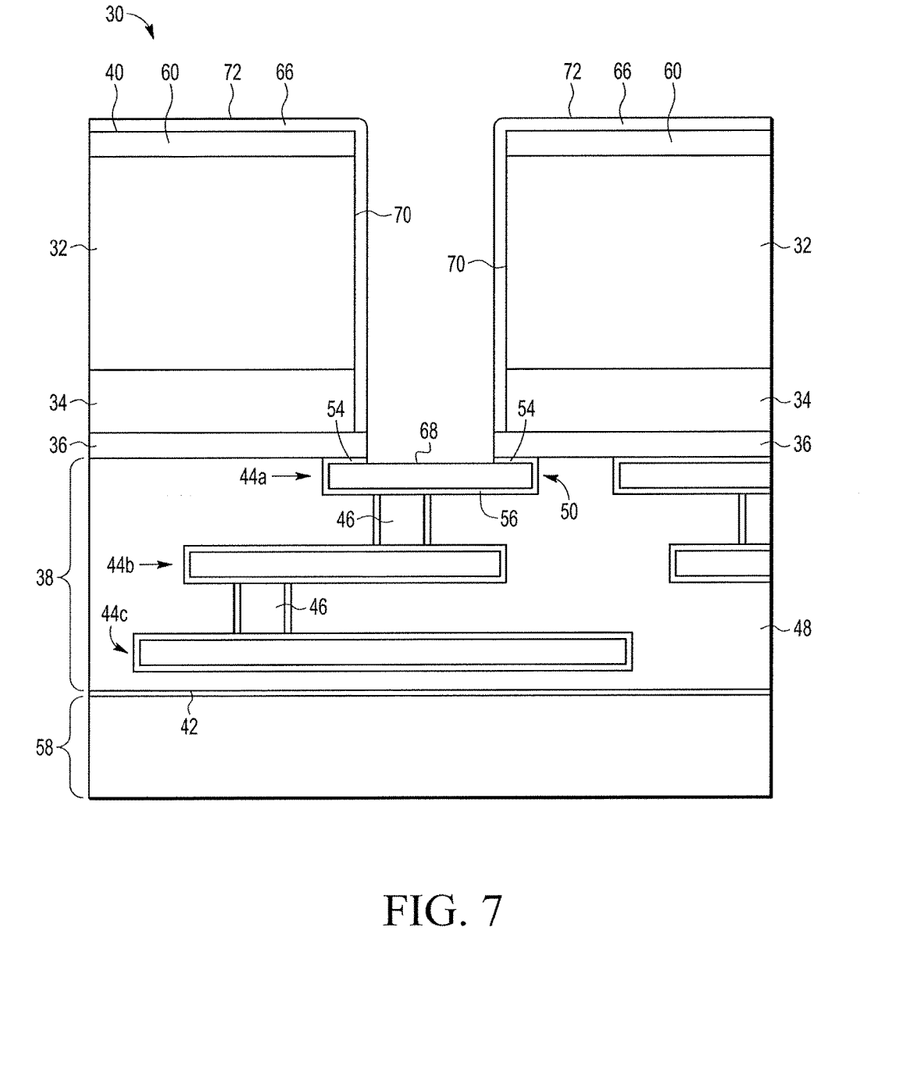
FIG. 7 is a cross-sectional, elevational view of the substrate of FIG. 6, at a subsequent process step according to the operational sequence of FIG. 1, showing an etch back of the insulation layer to expose an aluminum layer of a landing pad.

Next, at block 20, in the example embodiment as illustrated FIG. 6, an insulation layer 66 is deposited over exposed surfaces of the substrate including the sidewalls 70 of the TSV opening 64, which is then followed (at block 21; FIG. 7) by an etch back of the insulation material (e.g., insulation layers 36, 66) overlying the aluminum layer 52 to expose its upper surface 68.

In another embodiment, after removal of the mask and prior to depositing the insulation layer 66, an etch can be performed to fully or partially remove the insulation layer 36 overlying the aluminum layer 52 of the landing pad, which may expose the aluminum layer. The insulation layer 66 can then be deposited over the exposed surfaces of the substrate, followed by an etch back of the insulation material (e.g., insulation layers 36, 66) to expose the aluminum layer 52 of the landing pad 50, using one or more deposition/etching cycles.

In example embodiments, the insulation layer 66 is composed of an oxide (e.g., $SiO_2$), oxynitride (ON), silicon nitride ($Si_3N_4$), silicon oxynitride (SiON), polymer, or other suitable material. Deposition of the insulation layer 66 can be conducted by known low temperature processing methods, for example but not limited to, CVD deposition of a dielectric, plasma deposition of a TEOS-based oxide, high density plasma (HDP) deposition (e.g., HDP oxide, HDP TEOS), among others.

Next, at block 21 (FIG. 7), after depositing the insulation layer 66, an etch back of the insulation material (e.g., insulation layers 36, 66) overlying the aluminum layer 52 is then conducted. The etch back can be conducted by known methods, for example but not limited to, in a reactive ion etching (RIE) chamber containing $CF_4+H_2$ plasmas, $CF_4+CHF_3$ plasma, among others. Typically, the etch back to remove the insulation layers 36, 66 overlying the aluminum layer 52 is conducted such that some or all of insulation layer 66 and, in embodiments, a portion of insulating layer 60, at the top surface 72 can be removed, but little if any of the insulation layer 66 on the sidewalls 70 of the TSV opening is removed. One or more cycles of depositing the insulation layer 66 and then etching back the insulating material (e.g., 36, 66) can be performed as needed to expose the aluminum layer 52, with the last cycle ending in an etch back step.

Figure 8:
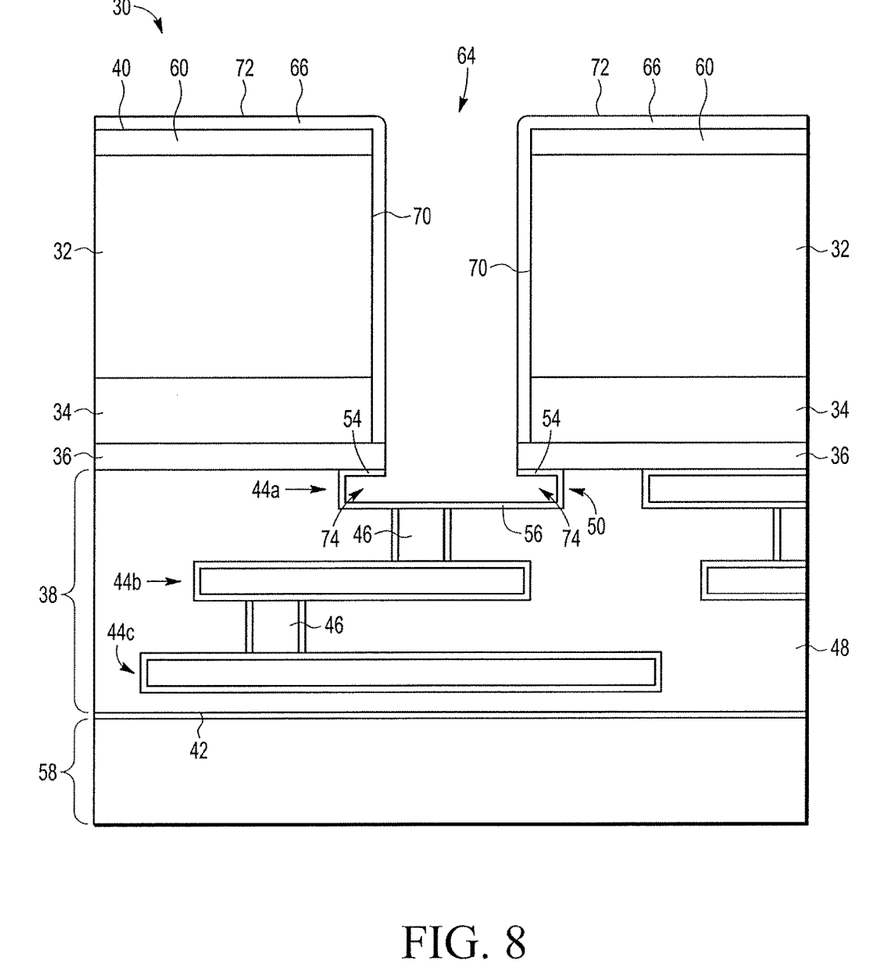
FIG. 8 is a cross-sectional, elevational view of the substrate of FIG. 7, at a subsequent process step according to the operational sequence of FIG. 1, showing an example embodiment of the wet etch removal of the aluminum layer of a TSV landing pad of the metallization structure.
Figure 9:
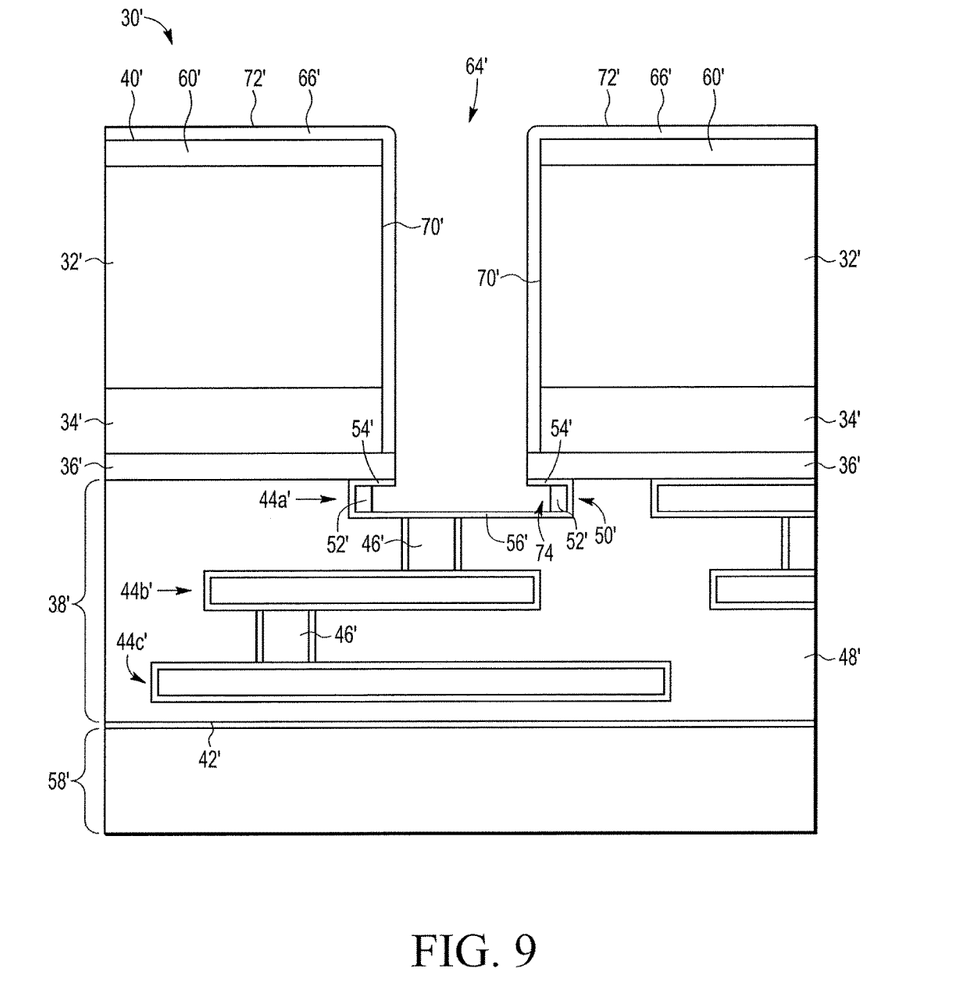
FIG. 9 is a cross-sectional, elevational view of the substrate of FIG. 7, at a subsequent process step according to the operational sequence of FIG. 1, showing another example embodiment of the wet etch removal of a portion of the aluminum layer of a TSV landing pad of the metallization structure.

Next, at block 22, the aluminum layer 52 of the TSV landing pad 50 is removed to form an opening to expose the second Ti/TiN layer 56, which opening is generally as wide as the TSV opening 64. As illustrated in FIG. 8, in an example embodiment, all of the aluminum layer 52 of the landing pad 50 is removed. In another example embodiment, as shown in FIG. 9, etching of the aluminum layer 52' can result in a portion of the aluminum layer 52' remaining between the first and second Ti/TiN barrier layers 54', 56'.

The aluminum layer 52 can be removed by a wet etch process using a Standard Clean (SC-1) solution and/or an aluminum etchant solution.

In an example embodiment, a heated Standard Clean (SC-1) solution composed of a mixture of water, aqueous hydrogen peroxide (30% by weight) and aqueous ammonium hydroxide (29% by weight of $NH_3$) in a ratio ($H_2O$:$H_2O_2$:$NH_4OH$) of 20 to 5:1 to 1:1 to 1, or 20 to 5:1:1, by volume, or, for example, at 20:1:1, 10:1:1, 5:1:1, by volume can be applied to remove the aluminum layer 46 to expose the second Ti/TiN barrier layer 56. In an example embodiment, the SC-1 solution is applied at a temperature of 40 to 50 C for a time effective to remove the aluminum layer 46 and form an opening to expose the second Ti/TiN barrier layer 56, for example but not limited to, 5 to 10 minutes.

In another example embodiment, wet etching the aluminum layer 46 can be performed using an aluminum etchant. An example of an aluminum etchant is a heated solution (35-45° C.) of phosphoric acid ($H_3PO_4$), nitric acid ($HNO_3$), acetic acid ($CH_3COOH$) and water. In an example embodiment, the aluminum etchant is composed of 65 to 80% phosphoric acid ($H_3PO_4$), 1 to 5% nitric acid ($HNO_3$), 5 to 10% acetic acid ($CH_3COOH$) and the balance water. In an example embodiment, the aluminum etchant solution comprises an aqueous mixture of phosphoric acid, nitric acid, acetic acid and water at a ratio ($H_3PO_4$:$HNO_3$:$CH_3COOH$:$H_2O$) of 80:5:5:10 by volume. In an example embodiment, the aluminum etchant solution can be applied at 35 to 45° C. for a time effective to remove the aluminum layer 46 and form an opening to expose the second Ti/TiN barrier layer 56, for example but not limited to, 30 to 120 minutes.

The wet etch solution(s) can be applied, for example, by directly immersing the CMOS device 30 into the wet etch solution. In another embodiment, prior to the immersion, the sidewalls 70 of the TSV opening 64 can be pre-wetted (e.g., by injecting water under vacuum) and the CMOS device then immersed into the wet etch solution. In embodiments, the CMOS device 30 can be immersed into the wet etch solution using ultrasonics to facilitate the flow of the wet etch solution(s) downward into the via.

In an example embodiment, the wet etching is continued until the aluminum layer 46 is removed to expose the second Ti/TiN layer 50, as illustrated in FIG. 8 (or in other embodiments, as illustrated in FIG. 9). After completion of the wet etch to remove the aluminum layer 52 (or 52'; FIG. 9), the CMOS structure 30 can be rinsed in water and dried.

The resulting through-substrate-via (TSV) opening 64 extends from the back surface 40 of the CMOS structure 30 to the second Ti/TiN layer 56 of the TSV landing pad 50 of the metal-1 layer 44a of the metallization (routing) structure 38. The depth and width of the TSV opening 64 can vary according to the device design. In an example embodiment, the depth of the TSV opening can range from 50 to 300 μm. In an example embodiment, the width of the TSV opening 64 can range from 5 to 30 μm.

Figure 10:
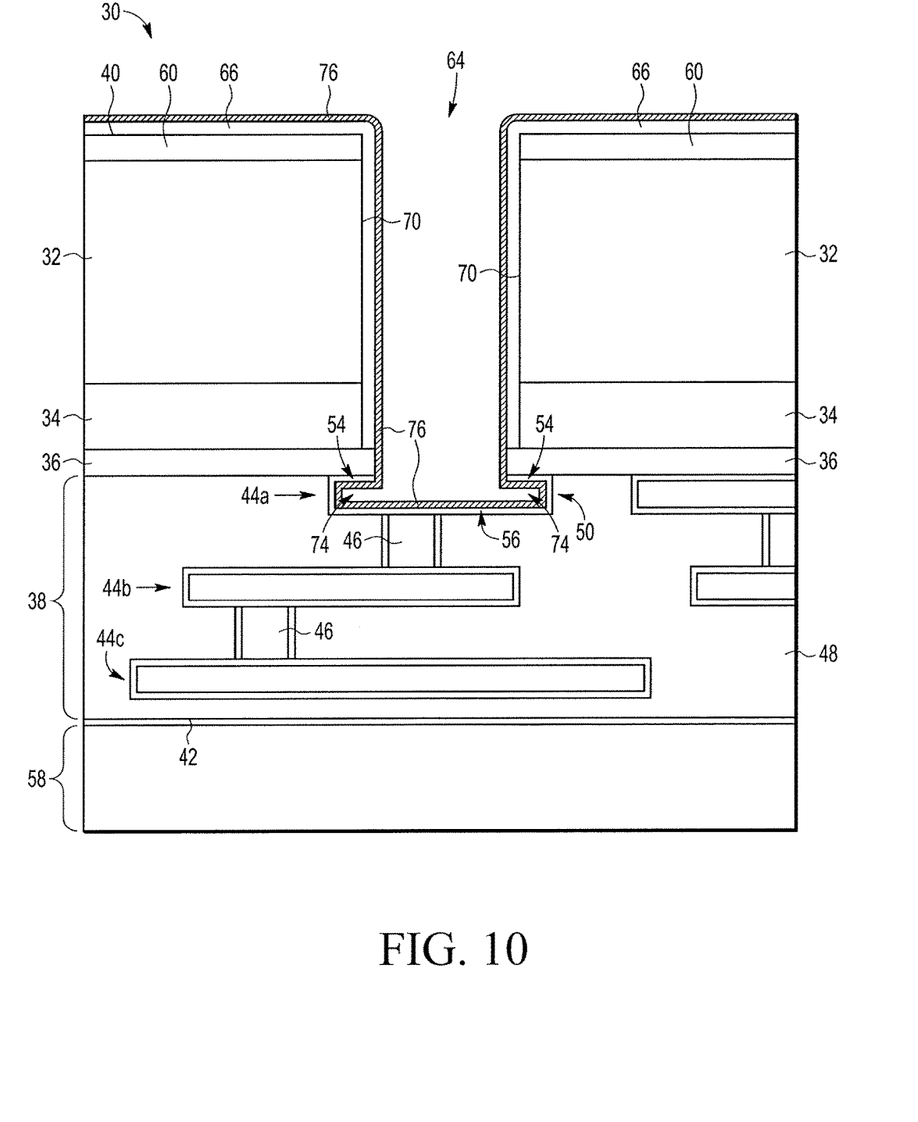
FIG. 10 is a cross-sectional, elevational view of the substrate of FIG. 8, at a subsequent process step according to the operational sequence of FIG. 1, showing the formation of a diffusion barrier layer on the exposed surfaces of the substrate.

Next, at block 24, a diffusion barrier layer 76 is formed over the exposed surfaces including the sidewalls 70, as illustrated in FIG. 10. Optionally, at block 25, a seed layer (not shown) for the electroplated conductive metal fill can be formed over the diffusion barrier layer prior to plating the copper fill.

In the example embodiment, the diffusion barrier layer 76 also functions as a seed layer to enable direct plating onto the barrier layer without the need for an additional copper seed layer. In another embodiment, the insulation layer 66 (e.g., silicon oxynitride (SiON)) can function as both the insulation layer and the diffusion barrier layer, whereby a separate diffusion barrier is not needed and a copper seed layer can be formed over the insulation (diffusion barrier) layer 66.

Figure 11:
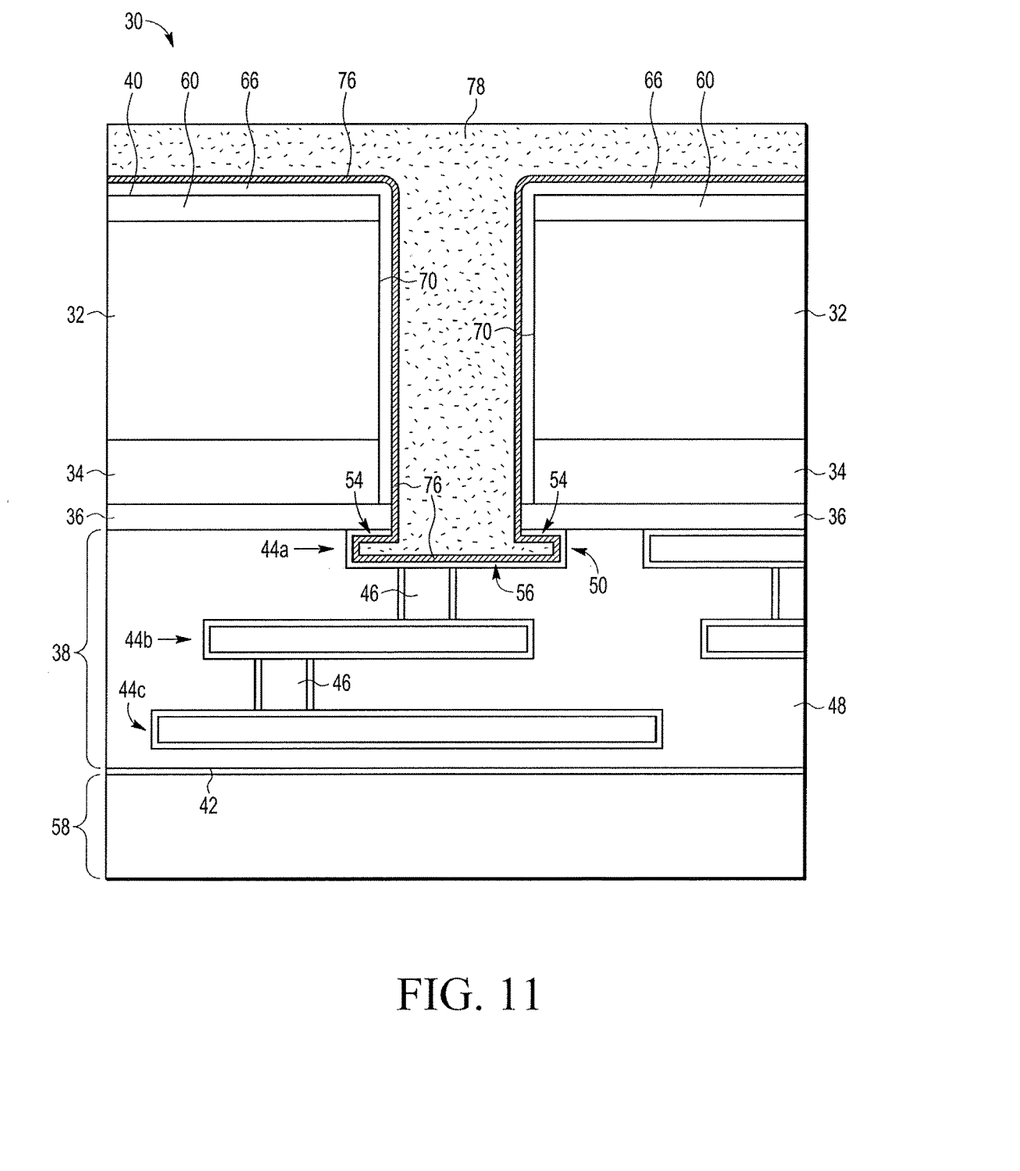
FIG. 11 is a cross-sectional, elevational view of the substrate of FIG. 10, at a subsequent process step according to the operational sequence of FIG. 1, showing the deposition of an electroplated metal material (e.g., copper) to fill the TSV opening and form a TSV interconnect.

Then, at block 26, a conductive metal 78 (e.g., copper or copper-based conductive material) is then electroplated to fill the opening 64 and form the TSV conductive contact 80. The diffusion barrier layer, the seed layer and electroplated metal fill can be formed by known techniques in the art.

In embodiments, a diffusion barrier layer 76 under copper can comprise, for example, a conductive metal such as titanium nitride (TiN), tantalum (Ta), tantalum nitride (TaN), tantalum silicon nitride (TaSiN), tungsten nitride (WN), nickel (Ni), a nickel-boron alloy (Ni(B)), a nickel-phosphorus alloy (Ni(P)), among other materials. In embodiments, the diffusion barrier layer 76 can comprise an oxide such as silicon oxynitride (SiON) silicon carbonitride (SiCN), silicon nitride ($Si_3N_4$), aluminum oxynitride (AlON), or alumina ($Al_2O_3$), tantalum oxide ($Ta_2O_5$), hafnium oxide ($HfO_2$) or other metal oxide. In embodiments, a seed layer (not shown) composed, for example, of nickel (Ni), copper (Cu) or other suitable material, can be deposited over the diffusion barrier layer 76.

The barrier layer (and seed layer) can be deposited to a desired thickness by known techniques in the art, for example, by sputtering (PVD), chemical vapor deposition (CVD), plasma-enhanced chemical vapor deposition (PECVD), atomic layer deposition (ALD), atomic layer chemical vapor deposition (ALCVD), electroless deposition, or other known technique in the art. A representative thickness of the diffusion barrier layer 76 is 10 to 1000 nm.

In an embodiment, the diffusion barrier layer 76 can be formed by an initial activation step in which an activation composition is applied to the exposed surfaces of the TSV opening 64, followed by an electroless deposition of a conductive metal (e.g., nickel-boron alloy (Ni—B)) to form a diffusion barrier layer 76, which also functions as a copper seed layer. An example embodiment of an activation step followed by an electroless deposition is described, for example, in US 2012/0196441 (Mevellec et al.; Alchimer).

At block 26 (FIG. 11), an electroplating process is then used to deposit a conductive metal fill 78 into the TSV opening 64 to form the TSV conductive interconnect 80. Electroplating tools and plating solutions are known in the art and commercially available. Electrodeposition of copper can be conducted from a conventional acidic (e.g., acid copper sulfate) or an alkaline (e.g., alkaline cyanide or non-cyanide) electroplating solution. The electroplating process is continued until a desired thickness of copper is deposited to fill the opening. The substrate can then be placed into a rinse bath to remove residual bath liquid and particles from the surface.

In an example embodiment in which the entire aluminum layer 52 of the TSV landing pad 50 is removed (e.g., as shown in FIG. 8), the copper fills the space 74 between the Ti/TiN barrier layers 54, 56, as illustrated in FIG. 11.

Figure 12:
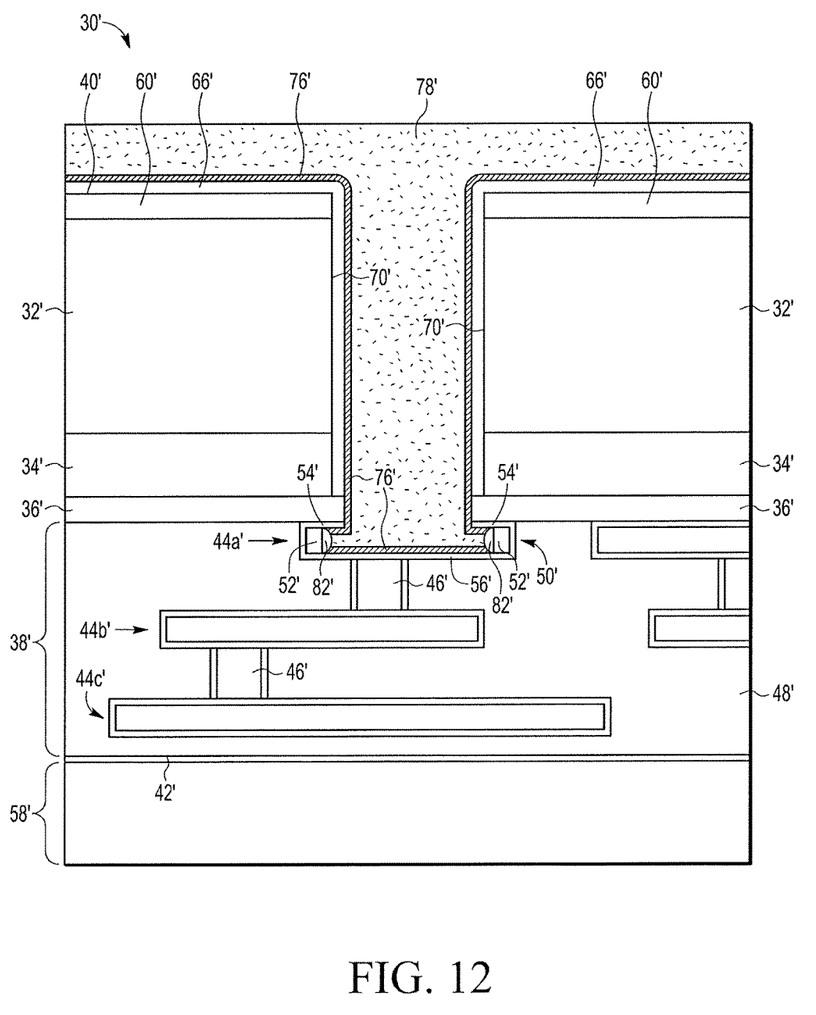
FIG. 12 is a cross-sectional, elevational view of the substrate of FIG. 9, at subsequent process step according to the operational sequence of FIG. 1, showing the deposition of an electroplated metal material (e.g., copper) to fill the TSV opening and form a TSV interconnect.

In another example embodiment, in which a portion (residue) of the aluminum layer 46' (or other landing material) of the TSV landing pad 44' remains following the wet etch step (FIG. 1, block 22; FIG. 9), the landing material residue 52' (e.g., aluminum) may not be compatible with the diffusion barrier layer 76', which does not then deposit as a coating over the residue layer 52' to cover it, as illustrated in FIG. 12. In the example embodiment in which the exposed landing material residue layer 52' (e.g., aluminum) is also incompatible with the optional seed layer and the copper electroplating chemistry, the seed layer and the copper do not then readily deposit (e.g., plate) onto the exposed residue layer 52', and a gap or void 82' occurs between the copper fill 78' and the residual layer metal layer 52' (e.g., aluminum), as illustrated in FIG. 12.

Figure 13:
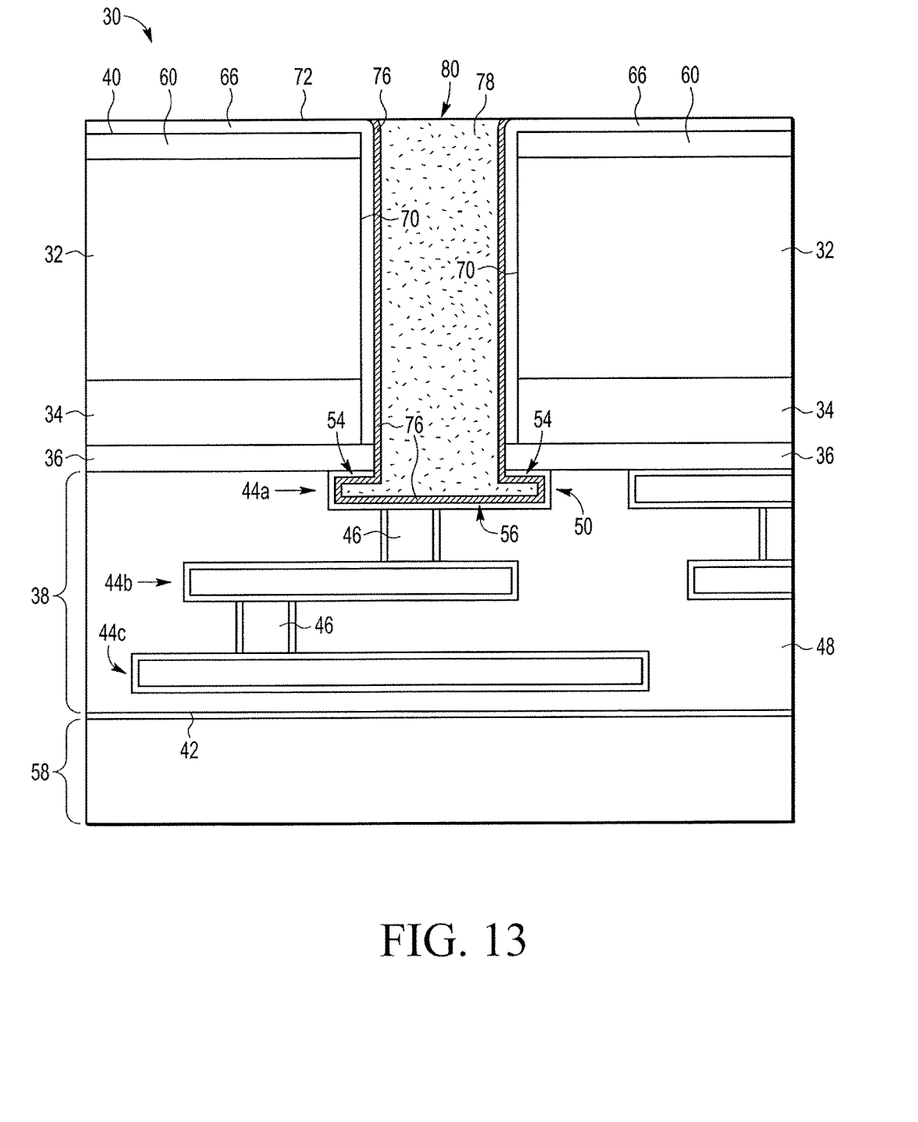
FIG. 13 is a cross-sectional, elevational view of the substrate of FIG. 11, at a subsequent process step according to the operational sequence of FIG. 1, showing the removal of excess metal (e.g., copper) overburden from the substrate.

Next, at block 28 (FIG. 13), after forming the TSV interconnect 80, excess of the deposited copper material (e.g., copper overburden) can be removed from the surface of the CMOS structure 30 by known methods in the art. In an example embodiment, excess copper material can be removed using a conventional dry etch or chemical mechanical polishing (CMP). The finished construction includes a conductive TSV contact (interconnect) 80 formed within the opening 64 of the CMOS structure 30, which extends through the structure 30 from the back surface 40 to the front surface 42, to a Ti/TiN layer 56 of a TSV landing pad 50 of a first metallization (e.g., metal-1) layer 44a. The substrate can then be further processed as desired. For example, a routing layer can be deposited and patterned, followed by a passivation layer formed over the RDL and patterned to expose contact pads on the RDL.

The terms "top," "bottom," "upper," "lower," "over," "under," "overlying," "underlying" and the like in the description and in the claims, if any, are used for descriptive purposes and not necessarily for describing permanent relative positions. It is understood that the terms so used are interchangeable under appropriate circumstances such that the example embodiments of the invention described herein are, for example, capable of operation in other orientations than those illustrated or otherwise described herein.

The terms "a" or "an," as used herein, are defined as one or more than one. Also, the use of introductory phrases such as "at least one," "at least two," and "one or more" in the claims should not be construed to imply that the introduction of another claim element by the indefinite articles "a" or "an" limits any particular claim containing such introduced claim element to devices, etc., containing only one such element, even when the same claim includes the introductory phrases "one or more" or "at least one" and indefinite articles such as "a" or "an." The same applies to the use of definite articles.

In the description, all numbers disclosed are approximate values, regardless whether the word "about" or "approximate" is used in connection therewith.

It is specifically intended that the present invention not be limited to the embodiments and illustrations contained herein, but include modified forms of those embodiments including portions of the embodiments and combinations of elements of different embodiments as come within the scope of the following claims.

We claim:

1. A method of forming a through-substrate-via (TSV) interconnect in a semiconductor substrate, comprising:
   providing a semiconductor substrate having a front surface and a back surface, and comprising a metallization structure at the front surface, and an active device layer within the semiconductor substrate and adjacent to the metallization structure, the metallization structure comprising a landing pad comprising a conductive metal layer interposed between first and second barrier layers;
   forming a through-substrate-via (TSV) through the semiconductor substrate from the back surface through the active device layer and the first barrier layer to expose the conductive metal layer of the landing pad;
   removing the conductive metal layer of the landing pad to extend the through-substrate-via (TSV) by a space within the metallization structure and expose the second barrier layer; and
   filling the through-substrate-via (TSV) including the space with copper to form the TSV interconnect.

2. The method of claim 1, wherein filling the TSV including the space with copper comprises forming a diffusion barrier layer and optionally a seed layer over exposed surfaces of the TSV including the space, and conducting a copper plating process, and
   the metal layer of the landing pad comprises a metal that is incompatible with the diffusion barrier layer, the optional seed layer and the copper plating chemistry such that the diffusion barrier layer, seed layer and copper do not form a coating over any residual portion of the metal layer and a gap or void is present between any residual portion of the metal layer and the copper.

3. The method of claim 2, wherein the metal layer of the landing pad comprises aluminum.

4. A method of forming a through-substrate-via (TSV) interconnect in a semiconductor substrate, comprising:
providing a device wafer having a front surface and a back surface, a metallization structure at the front surface, and an active device layer within the semiconductor substrate and adjacent to the metallization structure, the metallization structure comprising a landing pad comprising an aluminum layer interposed between a first and a second Ti/TiN barrier layer,
dry etching to form a through-substrate-via (TSV) through the device wafer from the back surface through the active device layer and the first Ti/TiN barrier layer to expose the aluminum layer of the landing pad;
wet etching to remove the aluminum layer to extend the through-substrate-via (TSV) to an exposed surface of the second Ti/TiN layer; and
filling the through-substrate-via (TSV) with copper by an electroplating process to form the TSV interconnect.

5. The method of claim 4, wherein the step of dry etching to form the through-substrate-via (TSV) comprises at least one of plasma etching, reactive ion etching (RIE), ion beam etching, magnetically enhanced RIE, inductively coupled plasma (ICP), and laser drilling.

6. The method of claim 4, wherein the step of wet etching to remove the aluminum layer comprises applying a Standard Clean (SC-1) solution, and aluminum etchant solution, or a combination thereof.

7. The method of claim 4, wherein the step of wet etching to remove the aluminum layer comprises applying a Standard Clean (SC-1) solution comprising an aqueous solution of hydrogen peroxide ($H_2O_2$) and ammonium hydroxide ($NH_4OH$).

8. The method of claim 7, wherein the Standard Clean (SC-1) solution comprises a mixture of water, aqueous hydrogen peroxide (30% by weight) and aqueous ammonium hydroxide (29% by weight of $NH_3$) in a ratio ($H_2O$:$H_2O_2$:$NH_4O$) of 20 to 5:1 to 1:1 to 1, by volume.

9. The method of claim 7, wherein the Standard Clean (SC-1) solution is applied at a temperature of 40 to 50° C.

10. The method of claim 4, wherein the step of wet etching to remove the aluminum layer comprises applying an aluminum etchant solution comprising an aqueous mixture of phosphoric acid, nitric acid, acetic acid and water at a ratio ($H_3PO_4$:$HNO_3$:$CH_3COOH$:$H_2O$) of 80:5:5:10 by volume.

11. The method of claim 10, wherein the aluminum etchant solution comprise 65 to 80% phosphoric acid ($H_3PO_4$), 1 to 5% nitric acid ($HNO_3$), 5 to 10% acetic acid ($CH_3COOH$) and the balance water.

12. The method of claim 10, wherein the aluminum etchant solution is applied at a temperature of 35-45° C.

13. The method of claim 4, wherein all of the aluminum layer is removed by the step of wet etching.

14. The method of claim 4, wherein after the step of wet etching, a residual portion of the aluminum layer remains.

15. The method of claim 14, wherein a gap is present between the copper fill and the residual portion of the aluminum layer.

16. The method of claim 4, wherein the step of filling the through-substrate-via (TSV) comprises:
optionally applying an activation composition to exposed surfaces of the TSV to form an activated surface;
forming a diffusion barrier layer over the exposed surfaces and optionally the activated surface;
optionally forming a seed layer over the diffusion barrier layer; and
depositing copper to fill the through-substrate-via (TSV) by an electrochemical deposition process.

* * * * *